United States Patent [19]
Gillette

[11] Patent Number: 5,905,403
[45] Date of Patent: May 18, 1999

[54] MULTIPLE OUTPUT PROGRAMMABLE REFERENCE VOLTAGE SOURCE

[75] Inventor: Garry C. Gillette, San Jose, Calif.

[73] Assignee: Credence Systems Corporation, Fremont, Calif.

[21] Appl. No.: 08/939,572

[22] Filed: Sep. 29, 1997

[51] Int. Cl.$^6$ .................................. G05F 1/10; H02J 3/38
[52] U.S. Cl. ............................................ 327/540; 327/530
[58] Field of Search .................................... 327/530, 538, 327/539, 540, 541, 542, 543

[56] References Cited

U.S. PATENT DOCUMENTS

| | | | |
|---|---|---|---|
| 5,170,158 | 12/1992 | Shinya | 340/800 |
| 5,578,957 | 11/1996 | Erhart et al. | 327/333 |
| 5,694,063 | 12/1997 | Burlison et al. | 327/50 |

*Primary Examiner*—Toan Tran
*Assistant Examiner*—Hai L. Nguyen
*Attorney, Agent, or Firm*—Smith-Hill and Bedell

[57] ABSTRACT

A programmable voltage source produces a set of output reference voltages having levels determined by a sequence of input data values, each input data value corresponding to a separate one of the reference voltages. The voltage source includes a charging current generator for generating a charging current and a set of sample and hold circuits, each corresponding to a separate one of the data values, each for producing a separate one of the output reference voltages. The charging current generator receives each data value in succession and supplies a charging current to the corresponding sample and hold circuit and that sample and hold circuit adjusts its output reference voltage by integrating the charging current. The charging current generator monitors the output reference voltage produced by that sample and hold circuit and sets the charging current to a level proportional to a difference between the reference voltage level and a level indicated by the input data. The reference voltage output of the sample and hold circuit therefore stabilizes at the level indicated by the input data.

12 Claims, 2 Drawing Sheets

MULTIPLE OUTPUT PROGRAMMABLE REFERENCE VOLTAGE SOURCE

BACKGROUND OF THE INVENTION

Field of the Invention

The present invention relates in general to reference voltage sources and in particular to a programmable reference voltage source for concurrently providing multiple output reference voltages.

Description of Related Art

A typical integrated circuit tester includes a set of pin electronics circuits, one for each terminal of an integrated circuit device under test (DUT). Each pin electronics circuit carries out all test activities at the corresponding DUT terminal. For example a pin electronics circuit may supply a test signal having particular high and low logic levels to the DUT terminal. Since the appropriate high and low logic levels for a test signal may vary from one DUT to another, and even from one pin to another, separate reference voltage signals are provided to each pin electronics circuit to indicate the appropriate high and low logic levels for the test signal. A pin electronics circuit also compares a DUT output signal produced at the terminal to other input reference voltage signals to determine the logic state of a DUT output signal at that terminal. Pin electronics circuits may also carry out various other test operations which require additional input reference voltage signals.

Thus each pin electronics circuit can require several input reference voltage signals. For example if an IC tester has 64 pin electronics circuits and each pin electronics circuit requires 8 adjustable input reference voltages, then the integrated circuit tester requires a programmable voltage source capable of producing 512 independently adjustable reference voltages. It is possible, but very expensive to use a separate digital-to-analog converter (DAC) to supply each reference voltage. What is needed is an inexpensive source of multiple reference voltages.

SUMMARY OF THE INVENTION

A programmable voltage source in accordance with one aspect of the present invention produces a set of output reference voltages having levels determined by a sequence of input data values, each input data value corresponding to a separate one of the reference voltages. The voltage source includes a charging current generator for generating a charging current and a set of sample and hold circuits, each corresponding to a separate one of the data values, each for producing a separate one of the output reference voltages. The charging current generator receives each data value in succession and supplies a charging current to the corresponding sample and hold circuit and that sample and hold circuit adjusts its output reference voltage by integrating the charging current. The charging current generator monitors the output reference voltage produced by that sample and hold circuit and sets the charging current to a level proportional to a difference between the reference voltage level and a level indicated by the input data. The reference voltage output of the sample and hold circuit quickly stabilizes at the level indicated by the input data.

In accordance with another aspect of the invention, the charging current generator includes a digital-to-analog converter (DAC) for drawing a current from a circuit node that is proportional to each input data value, a feedback circuit for supplying a current into the node that is proportional to the reference voltage output of the sample and hold circuit being adjusted, and a differential amplifier for producing the charging current according to a voltage produced at the node.

In accordance with a further aspect of the invention, the voltage source auto-zeros an offset of the differential amplifier during a time that the DAC requires to settle its output current a new level in response to each change in input data value.

It is accordingly an object of the invention to provide an inexpensive, programmable multiple reference voltage source.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

DESCRIPTION OF THE PREFERRED EMBODIMENT(S)

Figure 1:
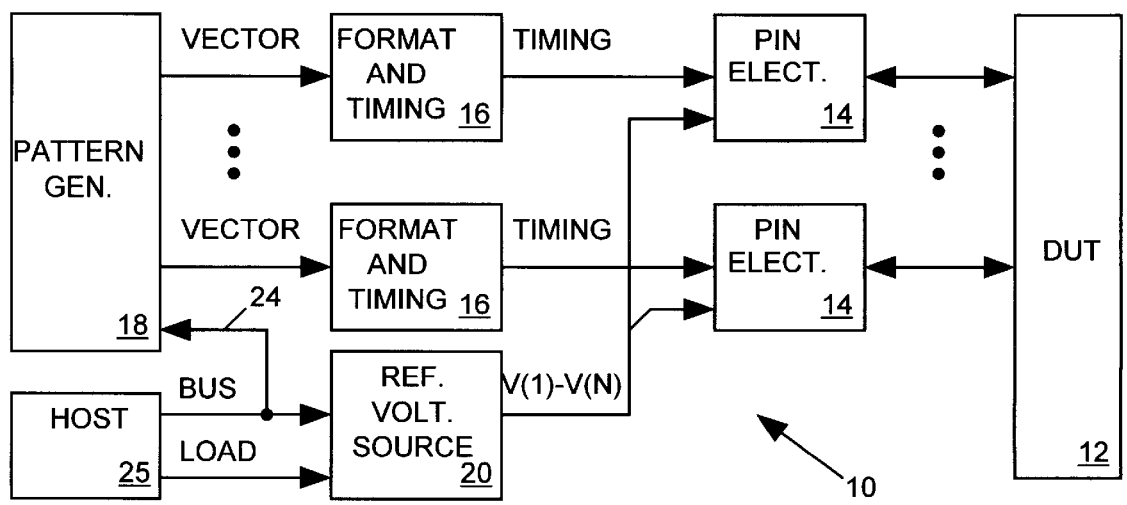
FIG. 1 illustrates in block diagram form an integrated circuit tester employing a multiple output, programmable reference voltage source in accordance with the present invention.

FIG. 1 illustrates an integrated circuit tester 10 for testing an integrated circuit device under test (DUT) 12. Tester 10 includes a set of pin electronics circuits 14, each connected to a separate input/output terminal of DUT 12. Each pin electronics circuit 14 carries out test activities at the corresponding DUT terminal in response to a set of M TIMING signals from a corresponding format and timing circuit 16. Each TIMING signal controls a separate function of the pin electronics circuit 14. A pattern generator 18, programmed with instructions from an external host computer 25 via a conventional computer bus 24, supplies a separate pattern vector (data word) to each format and timing circuit 16 for each cycle of the test. Each pattern vector tells a format and timing circuit 16 when to make state changes in its output TIMING signals during the test cycle.

Each pin electronics circuit 14 can carry out a variety of test activities at the DUT terminal. For example in response to some of its input TIMING signals, a pin electronics circuit 14 may supply a test signal to the DUT terminal and may toggle the test signal between high and low logic levels at times indicted by state changes in the TIMING signals. Since the appropriate high and low logic levels for a test signal may vary from one DUT to another, and even from one DUT terminal to another, a reference voltage source 20, programmed by data from host computer 25 via computer bus 24, supplies separately adjustable reference voltage signals to each pin electronics circuit 14 to indicate the appropriate high and low logic levels for the test signal. Pin electronics circuits 14 also compare a DUT output signal produced at the terminal to other reference voltage signals provided by source 20 to determine the logic state of a DUT output signal at that terminal. Pin electronics circuits 14 may also carry out various other test operations which require additional reference voltage signals from source 20.

Thus source 20 must produce several adjustable reference voltage signals for each pin electronics circuit 14. For example if tester 10 has 64 pin electronics circuits 14 and each pin electronics circuit 14 requires 8 adjustable input reference voltages, then source 20 must provide N=512 independently adjustable reference voltages V1–VN to the pin electronics circuits. Pattern generator 18, format and timing circuits 16 and pin electronics circuits 14 are well known in the art and are not further detailed herein. The present invention relates to reference voltage source 20 and its use in an integrated circuit tester. Reference voltage source 20 is discussed in detail herein below.

Programmable Reference Voltage Source

Figure 2:
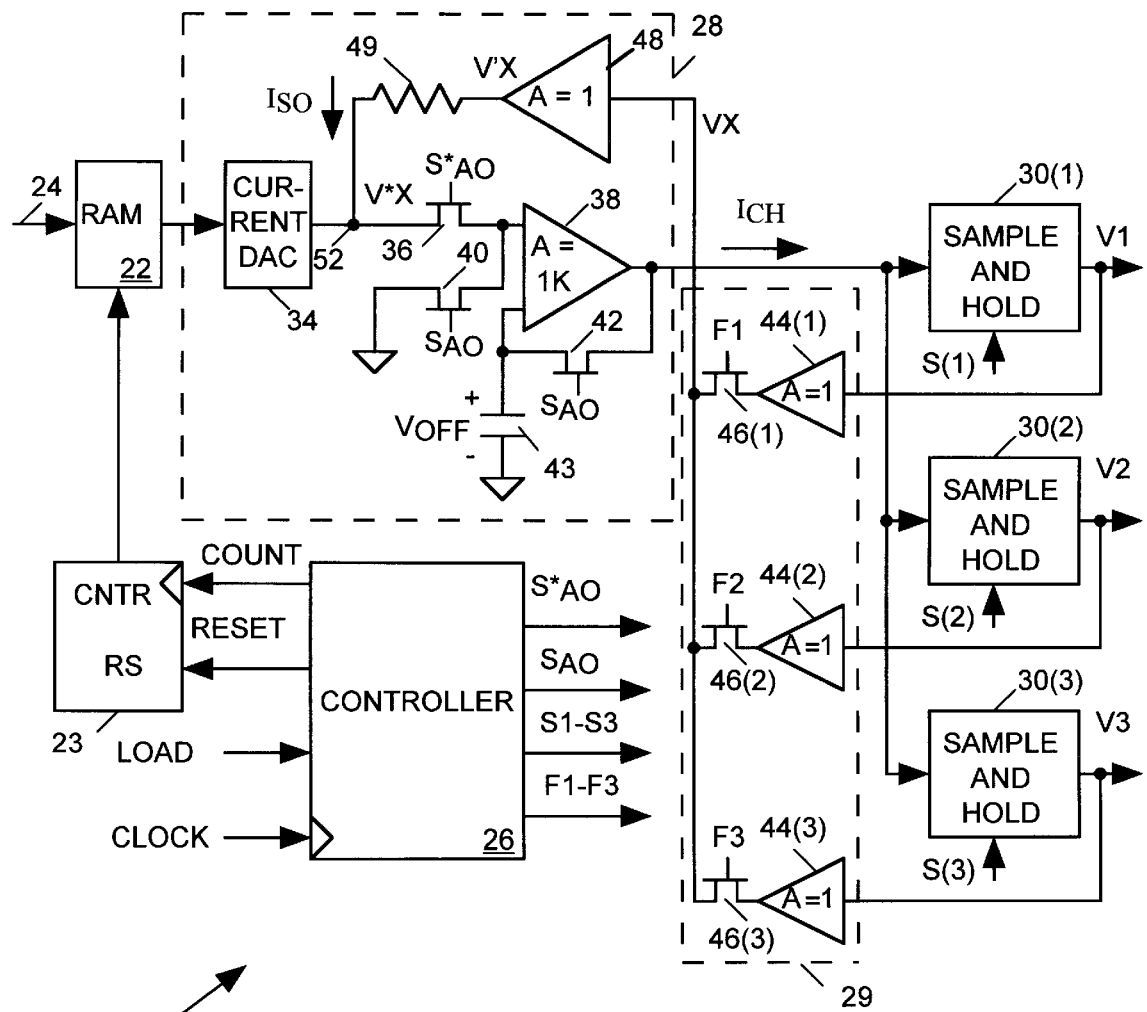
FIG. 2 illustrates the programmable reference voltage of FIG. 1 in more detailed block diagram form.

FIG. 2 illustrates programmable reference voltage source 20 of FIG. 1 in more detailed block diagram form, where the number N of output reference voltages V1–VN is 3. Source 20 includes a conventional random access memory system (RAM) 22 write accessed by a host computer 25 of FIG. 1 through computer bus 24. RAM 22, which includes a conventional memory controller for receiving data, address and control signals via computer bus 24, provides N=3 addressable storage locations each corresponding to a separate one of the N=3 output reference voltages V1–V3 source 20 produces. To program reference voltage source 20, the host computer 25 of FIG. 1 writes a data value to each RAM 22 storage location via bus 24. Each data value indicates the desired level of a separate one of reference voltage V1–V3.

Reference voltage source 20 also includes a set of three conventional sample and hold circuits 30(1)–30(3), each of which produces a separate one of output reference voltages V1–V3. The level of the output voltage V1–V3 of each sample and hold circuit 30(1)–30(3) is proportional the charge on an internal capacitor (not shown) within the sample and hold circuit. When placed in a sampling mode, the output reference voltage V1–V3 produced by any one of sample and hold circuit 30(1)–30(3) may be adjusted by a charging current $I_{CH}$ produced by a charging current generator 28. Charging current $I_{CH}$ may increase or decrease a charge on an internal capacitor (not shown) within the sample and hold circuit 30(1)–30(3) operating in the sample mode. When subsequently placed in a hold mode, each sample and hold circuit 30(1)–30(3) produces its output reference voltage V1–V3 in accordance with the charge on its internal capacitor that it acquired during a preceding sample mode. A set of signals S1–S3 produced by controller 26 switches sample and hold circuits 30(1)–30(3) between there sample and hold modes. Thus, when placed in a sampling mode by one of the S1–S3 signals, each sample and hold circuit 30(1)–30(3) adjusts its output voltage by integrating the charging current $I_{CH}$.

The output count of counter 22 is normally 0 so that when host computer 25 of FIG. 1 is not loading data into RAM 22, RAM 22 outputs the data value stored at address 0. After loading the appropriate data into RAM 22, the host computer transmits a LOAD signal pulse to a controller 26. Controller 26, a conventional sequencer clocked by an input system signal (CLOCK), responds to the LOAD signal pulse by asserting a pair of control signals S1 and F1. The S1 signal puts sample and hold circuit 30(1) in the sample mode in which charging current $I_{CH}$ output of generator 28 adjusts the charge on the capacitor within sample and hold circuit 30(1), thereby adjusting its output reference voltage V1. The F1 control signal causes a feedback circuit 29 to provide reference voltage V1 as feedback voltage input VX to charging current generator 28. The magnitude of the charging current $I_{CH}$ produced by generator 28 is proportional to a difference between the magnitude of a feedback voltage VX provided as input to generator 28 and the magnitude of a desired voltage level referenced by the data value output of RAM 22. Thus if reference voltage V1 (and therefore feedback voltage VX) is lower than the desired voltage level, the charging current $I_{CH}$ increases the charge on the capacitor in sample and hold circuit 30(1) to increase V1. If reference voltage V1 is higher than the desired voltage level, the feedback voltage VX causes generator 28 to set the charging current $I_{CH}$ so that it decreases the charge on the capacitor in sample and hold circuit 30(1) to decrease V1. As the level of output voltage V1 reaches the desired level indicated by the data input to generator 28 from RAM 22, generator 28 reduces the charging current $I_{CH}$ to the very small leakage current of the internal capacitor of sample and hold circuit 30(1), essentially zero.

At that point, with output reference voltage V1 stabilized to the desired level, controller 26 deasserts the S1 and F1 control signals, asserts the S2 and F2 control signal and clocks counter 23. The S2 signal puts sample and hold circuit 30(1) in the sample mode, the F2 signal feeds voltage V2 back to generator 28 as feedback voltage VX. The count output of counter 23 now causes RAM 22 to read out a data value stored at address 1. That data value indicates a desired level for the output voltage V2 of sample and hold circuit 30(2). The output voltage V2 of sample and hold circuit 30(2) thereafter stabilizes at a level indicted by the value of the data read out of RAM 22 address 1.

Controller 26 then clocks counter 23 once more, deasserts the S2 and F2 signals and asserts control signals S3 and F3. Sample and hold circuit 30(3) now enters the sampling mode with its output voltage V3 controlling the feedback voltage VX to charging current generator 28. With RAM 22 reading out a data value stored at address 2 to charging current generator 28, sample and hold circuit 30(3) output voltage V3 stabilizes at the level indicated that the data. Controller 26 thereafter deasserts S3 and F3, resets counter 23, and waits for another LOAD signal from host 25 of FIG. 1. The process of programming voltage source 20 is now complete.

The charging current generator 28 includes a current digital-to-analog converter (DAC) 34. DAC 34 responds to the data output of RAM 22 by drawing a current $I_{SO}$ from a circuit node 52 that is proportional to the magnitude of that data. An FET pass transistor 36 controlled by a signal $S^*_{AO}$ from controller 26 selectively connects node 52 to a first input of a differential amplifier 38, suitably having a gain of 1000. A capacitor 43 couples the second input of amplifier 38 to ground. A second FET pass transistor 40 selectively grounds the first input of differential amplifier 38 in response to another signal $S_{AO}$ from controller 26. A third FET pass transistor 42, also controlled by the $S_{AO}$ signal, selectively connects the output of amplifier 38 to its second input. Amplifier 38 produces the output current $I_{SO}$ of current generator 28 by amplifying the small voltage difference across its inputs.

Feedback circuit 29 includes a set of unity gain amplifiers 44(1)–44(3) each amplifying the output voltage V1–V3 of a corresponding sample and hold circuit 30(1)–30(3). A set of FET pass transistors 46(1)–46(3), controlled by the F1–F3 control signals from controller 26, each selectively connect the output of a corresponding one of amplifiers 44(1)–44(3) to provide feedback voltage VX to an input of a unity gain amplifier 48 within charging current generator 28. Amplifier 48, coupled to the output of DAC 34 through a resistor 49, produces a voltage V'X that is equal to a selected one of output voltages V1–VN, depending on which of transistors 44(1)–44(3) is turned on. Amplifier 48 supplies the current $I_{SO}$ through resistor 49 into current DAC 34. Most of V'X drops across resistor 49, leaving only a small offset voltage across the inputs of amplifier 38. Amplifier 38 amplifies that voltage to produce its output charging current $I_{CH}$. If the current $I_{SO}$ generated by amplifier 48 in response to VX is less than current drawn by DAC 34, amplifier 38 produces a positive charging current $I_{CH}$, thereby increasing the particular reference voltage V1–V3 currently controlling Vx. If the current $I_{SO}$ generated by amplifier 48 in response to VX is greater than current drawn by DAC 34, amplifier 38 produces a negative charging current $I_{CH}$, thereby decreasing the particular reference voltage V1–V3 currently controlling VX.

Figure 3:
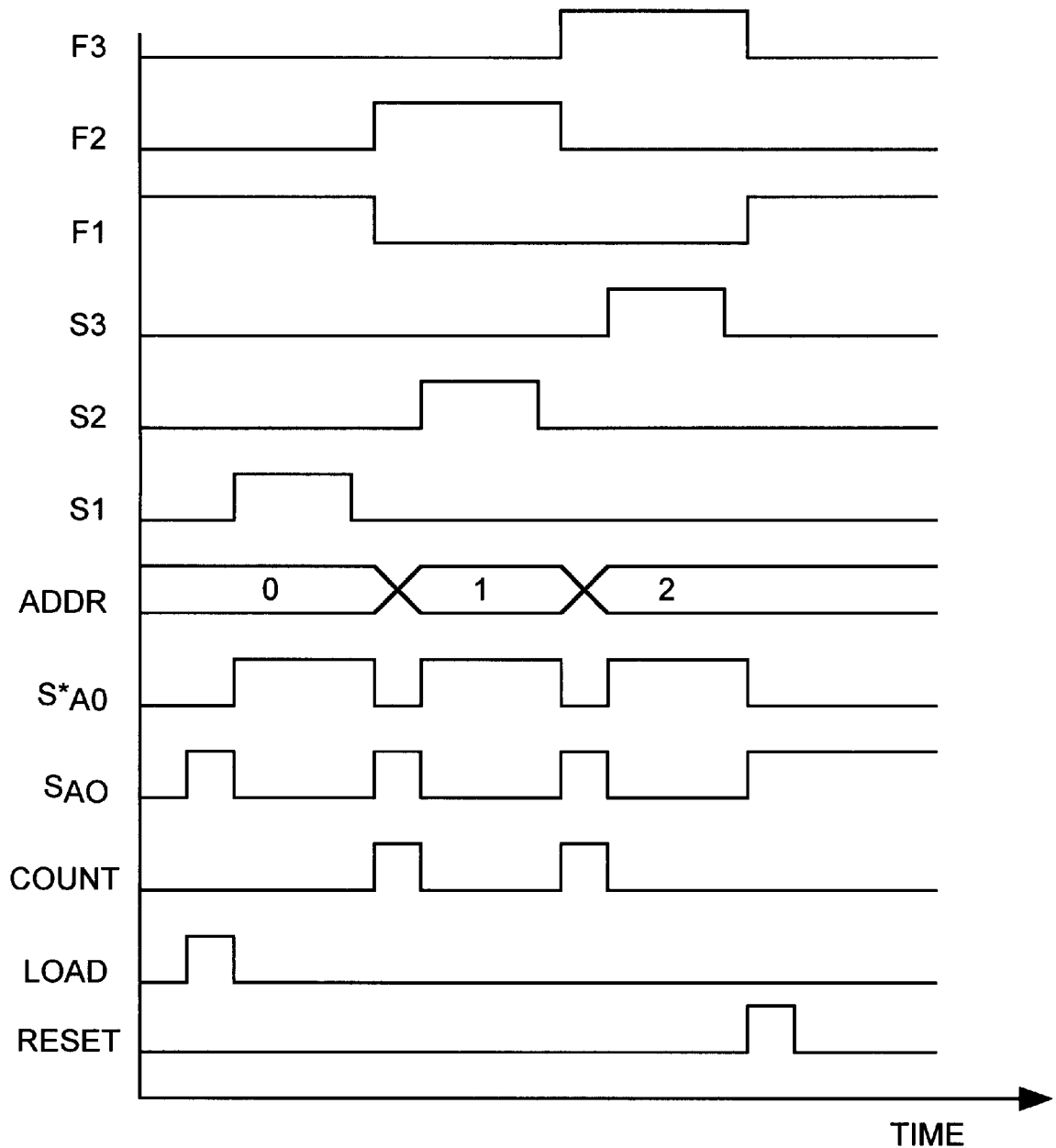
FIG. 3 is a timing diagram illustrating behavior of various signals of the programmable reference voltage source FIG. 2.

FIG. 3 is a timing diagram illustrating behavior of various signals of voltage source 20 FIG. 2. Until it receives a LOAD signal pulse, controller 26 of FIG. 2 normally asserts the F1 signal to turn on transistor 46(1) and normally deasserts the F2 and F3 signals to turn off transistors 46(2) and 46(3). Controller 26 also normally deasserts the S1–S3 signals so that sample and hold circuits 30(1)–30(3) are all in their hold modes. Counter 23 normally holds its output count at 0 so that RAM 22 reads out the data stored at its first storage location (address 0) when host 25 of FIG. 1 is not otherwise writing data into RAM 22. With pass transistor 46(1) turned on, amplifiers 44(1) and 48 normally use V1 to provide the feedback voltage VX to generator 28.

When host computer 25 of FIG. 1 sends a LOAD signal pulse to controller 26 after loading data into RAM 22, controller 26 briefly asserts the $S_{AO}$ signal to turn on transistors 40 and 42 thereby grounding the first input of amplifier 38 and connecting the output of amplifier 38 to its second input. This causes capacitor 43 to charge to the offset voltage of amplifier 38, the voltage it produces when its first input is at ground level. Since amplifier 38 is supposed to produce an output voltage that is 1000 times larger than the small voltage V*X appearing at node 52, it is necessary compensate for the offset so that charging current $I_{CH}$ is substantially 0 amps when a 0 volt V*$_{SO}$ signal is supplied to amplifier 38. By charging capacitor 43 to $V_{OFF}$ the programmable voltage source 20 "auto-zeros" amplifier 38 so that thereafter, when transistors 40 and 42 are off and transistor 36 is on, amplifier 38 output current $I_{OUT}$ is directly proportional to its input voltage V*X and has negligible offset. When amplifier 38 is implemented using CMOS transistors, $V_{OFF}$ can be relatively large. After capacitor 43 has had time to charge to the appropriate offset voltage $V_{OFF}$, controller 26 deasserts the $S_{AO}$ signal and asserts the S*$_{AO}$ and S1 signals, thereby turning off transistors 40 and 42 and turning on transistors 36 and 46(1). Amplifier 38 then produces its output current $I_{CH}$ that stabilizes at a value determined by the data at RAM 22 address 0. Sample and hold circuit 30(1), being placed in its sample mode by S1, sets its output reference voltage signal V1 to a value proportional to the output data of RAM 22. With transistor 46(1) turned on, amplifier 44(1) feed backs the new value of V1 to charging current generator 28, thereby altering the voltage V*(X) at node 52. The feedback loop though amplifiers 38, 44(1) and 48 and sample and hold circuit 30(1) quickly causes $I_{SO}$ and V* (X) to stabilize with the voltage $V_{OFF}$ across capacitor 43 compensating for the inherent offset of amplifier 38. At that point, the reference voltage output V1 of sample and hold circuit 30(1) stabilizes at the value indicated by the data output of RAM 22.

After allowing sufficient time for the value of reference voltage V1 to stabilize, controller 26 de-asserts the S1 signal causing sample and hold circuit 30(1) to thereafter hold the magnitude of V1 to its current level regardless of subsequent changes in the magnitude of $I_{OUT}$. After it turns off the Si signal, controller 26 turns off the S*A0 signal and turns on the $S_{AO}$ signals to auto-zero amplifier 38 again. It also turns off the F1 signal and turns on the F2 signal to turn off transistor 46(1) and turn on transistor 46(2), thereby supplying V2 as the feedback voltage VX to charging current generator 28.

After $V_{OFF}$ has had time to stabilize, controller 26 turns on the S*$_{AO}$ signal and turns off the $S_{AO}$ signal, thereby turning on transistor 36 and turning off transistors 40 and 42. Controller 26 also supplies a COUNT signal pulse to clock counter 50 causing it to increment the address ADDR supplied to RAM 22 so that RAM 22 supplies to current DAC 34 the data at RAM address 1 that is to control the value of V2. Controller 26 then turns on the S2 signal so that the charging current $I_{CH}$ begins adjusting the charge on the capacitor within sample and hold circuit 30(2), thereby to adjust reference voltage V2. After reference voltage V2 has had time to stabilize to the level indicated by the data of RAM 22 address 1, controller 26 deasserts S2 causing sample and hold circuit 30(2) to hold V2 at that level. Controller 26 also deasserts F2 and asserts F3 so that V3 now controls the feedback voltage VX to charging current generator 28. Controller 26 thereafter deasserts the SA0 signal and asserts the S*$_{AO}$ signal to autozero amplifier 38 once again.

After $V_{OFF}$ has had time to stabilize, controller 26 turns on the S*$_{AO}$ signal and turns off the $S_{AO}$, thereby turning on transistor 36 and turning off transistors 40 and 42. Controller 26 also supplies another COUNT signal pulse to counter 50 causing it to increment the address supplied to RAM 22 so that RAM 22 reads out the data at RAM address 2 that is to control the value of V3. Controller 26 then turns on the S3 signal so that the charging current $I_{CH}$ begins adjusting the charge on the capacitor within sample and hold circuit 30(3), thereby adjusting reference voltage V3. After reference voltage V3 has had time to stabilize to the value indicated by the data of RAM 22 address 2, controller 26 deasserts S3. Controller 26 also deasserts the SA0 signal and asserts the S*$_{AO}$ signal to auto-zero amplifier 38 once again.

At this point all output voltages V1–V3 are held a values indicated by data in RAM 22. Controller 26 turns off F3, turns on Fl, and sends a RESET pulse to counter 29 to reset its count output to 0. Controller 26 then waits until it receives another LOAD signal from the HOST before starting the process again.

Note that when capacitor 43 has sufficiently low leakage, it is not necessary to auto-zero amplifier 38 every time RAM 22 reads out a new data value, though with any small amount of leakage it would be necessary to do so occasionally. However it since DAC 34 requires a small amount of time to settle its output current is, after receiving a new input data value from RAM 22, controller 26 can use that short period of time to auto-zero amplifier 38. Thus the process of auto-zeroing amplifier 38 after each data value is read out of RAM 22 does not increase the total time required to set the output reference voltages V1–VN to their new values.

Thus has been described a programmable, multiple output voltage reference source in accordance with the present invention. For example, while voltage source 20 is illustrated in FIG. 2 as providing N=3 output reference voltages, those skilled in the art will appreciate that it may be easily expanded to provide a larger number of output voltages by increasing the number of sample and hold circuits 30 and making appropriate adjustments to feedback circuit 29 and controller 26. Thus while the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. An apparatus for generating a plurality of reference voltages, the apparatus comprising:
 a charging current generator (28) for generating a charging current of magnitude proportional to a difference between a level of a feedback voltage supplied as input thereto and a level referenced by a data value supplied as input thereto;
 a plurality of sample and hold circuits (30), each for producing an output reference voltage by integrating said charging current when operating in a sampling mode, each holding its output reference voltage at a constant level irrespective of said charging current when otherwise operating in a hold mode, and
 control means (22,23,26,29) for applying a sequence of data values as input to said charging current generator, each of said data values corresponding to a separate one of said sample and hold circuits, for placing each of said sample and hold circuits in said sampling mode when supplying its corresponding data value to said charging current generator and otherwise placing each of said sample and hold circuits in said hold mode, and for supplying said feedback voltage to said charging current generator with the feedback voltage level being controlled by the output reference voltage of any sample and hold circuit operating in said sampling mode.

2. The apparatus in accordance with claim 1 wherein said charging current generator means comprises:
 a circuit node (52),
 first amplifier means (48,49) for amplifying said feedback voltage to supply a first current into said circuit node;
 digital-to-analog converter means (34) for receiving each of said data values and for drawing a second current from said circuit node, said second current having a level set in response to each received data value; and
 second amplifier means (36,38,40,42,43) for amplifying a voltage level produced at said circuit node to generate said charging current.

3. The apparatus in accordance with claim 2 wherein said second amplifier means comprises:
 a ground node;
 a differential amplifier (38) having first and second input terminals and having an output terminal, for amplifying a voltage difference between said first and second input terminals to produce said charging current at said output terminal;
 first switch means (36) which, when closed, connects said first input terminal to said circuit node and which, when opened, disconnects said first terminal from said circuit node;
 second switch means (40) which, when closed, connects said first input terminal to said ground node and which, when opened, disconnects said first terminal from said ground node;
 third switch means (42) which, when closed, connects said amplifier output terminal to said second input terminal and which, when opened, disconnects said amplifier output terminal from said second input terminal; and
 a capacitor (43) coupling said second input terminal to said ground node.

4. The apparatus in accordance with claim 3 wherein said control means closes said first switch means and opens said second and third switch means for a period of time after supplying each data value to said digital-to-analog converter means, and for otherwise opening said first switch means and closing said second and third switch means.

5. An apparatus for supplying logic signals to a plurality of terminals of a circuit device under test (DUT), the apparatus comprising:
 a plurality of pin electronics circuits (14), each generating and supplying a logic signal to a separate DUT terminal, the logic signal generated by each pin electronics circuit alternating between first and second logic levels set in accordance with reference voltages supplied as input to said pin electronics circuit; and
 reference voltage source means (20) for generating and supplying separate reference voltages to each of said pin electronics circuits, said reference voltage source means comprising:
  a charging current generator (28) for generating a charging current of magnitude proportional to a difference between a level of a feedback voltage supplied as input thereto and a level referenced by a data value supplied as input thereto;
  a plurality of sample and hold circuits (30), each for producing an output reference voltage by integrating said charging current when operating in a sampling mode, each holding its output reference voltage at a constant level irrespective of said charging current when otherwise operating in a hold mode, and
  control means (22,23,26,29) for applying a sequence of data values as input to said charging current generator, each of said data values corresponding to a separate one of said sample and hold circuits, for placing each of said sample and hold circuits in said sampling mode when supplying its corresponding data value to said charging current generator and otherwise placing each of said sample and hold circuits in said hold mode, and for supplying said feedback voltage to said charging current generator with the feedback voltage level being controlled by the output reference voltage of any sample and hold circuit operating in said sampling mode.

6. The apparatus in accordance with claim 5 wherein said charging current generator means comprises:
 a circuit node (52),
 first amplifier means (48,49) for amplifying said feedback voltage to supply a first current into said circuit node;
 digital-to-analog converter means (34) for receiving each of said data values and for drawing a second current from said circuit node, said second current having a level set in response to each received data value; and
 second amplifier means (36,38,40,42,43) for amplifying a voltage level produced at said circuit node to generate said charging current.

7. The apparatus in accordance with claim 6 wherein said second amplifier means comprises:
 a ground node;
 a differential amplifier (38) having first and second input terminals and having an output terminal, for amplifying a voltage difference between said first and second input terminals to produce said charging current at said output terminal;
 first switch means (36) which, when closed, connects said first input terminal to said circuit node and which, when opened, disconnects said first terminal from said circuit node;

second switch means (40) which, when closed, connects said first input terminal to said ground node and which, when opened, disconnects said first terminal from said ground node;

third switch means (42) which, when closed, connects said amplifier output terminal to said second input terminal and which, when opened, disconnects said amplifier output terminal from said second input terminal; and a capacitor (43) coupling said second input terminal to said ground node.

8. The apparatus in accordance with claim 7 wherein said control means closes said first switch means and opens said second and third switch means for a period of time after supplying each data value to said digital-to-analog converter means, and for otherwise opening said first switch means and closing said second and third switch means.

9. A method for producing a set of reference voltages having levels determined by a set of input data values, each input data value indicating a desired level of a corresponding one of the reference voltages, the method comprising supplying a charging current to each of a plurality of sample and hold circuits, each sample and hold circuit corresponding to a separate one of the data values and each producing the corresponding reference voltage by integrating the charging current, the charging current supplied to each sample and hold circuit having a magnitude that is proportional to a difference between the reference voltage produced by the sample and hold circuit and the desired level indicated by the corresponding data value.

10. A programmable voltage source for producing a set of output reference voltages having levels determined by a sequence of input data values, each input data value corresponding to a separate one of the reference voltages the voltage source comprising:

a charging current generator for generating a charging current; and a plurality of sample and hold circuits, each corresponding to a separate one of the data values, each for producing a separate one of the output reference voltages, wherein the charging current generator receives each input data value in succession and supplies a charging current to the corresponding sample and hold circuit, wherein that sample and hold circuit adjusts its output reference voltage by integrating the charging current, and wherein the charging current generator monitors the output reference voltage produced by that sample and hold circuit and sets the charging current to a level proportional to a difference between the reference voltage level and a level indicated by the corresponding input data value.

11. The programmable voltage source in accordance with claim 10 wherein the charging current generator includes:

a circuit node;

a ground node;

a digital-to-analog converter (DAC) for drawing a current from said circuit node that is proportional to each input data value, means for supplying a current into the node that is proportional to the reference voltage output of the sample and hold circuit adjusting its output reference voltage, and a differential amplifier for producing the charging current according to a voltage difference between said circuit node and said ground node.

12. The programmable voltage source in accordance with claim 11 further comprising means for auto-zeroing the differential amplifier immediately after the DAC receives each input data value.

* * * * *